United States Patent
Wu

(10) Patent No.: US 6,963,194 B2
(45) Date of Patent: Nov. 8, 2005

(54) ANALOG SIGNAL MEASURING DEVICE AND METHOD

(75) Inventor: Hsin-An Wu, Bade (TW)

(73) Assignee: Quanta Computer Inc., Tao Yuan Shien (TW)

( * ) Notice: Subject to any disclaimer, the term of this patent is extended or adjusted under 35 U.S.C. 154(b) by 24 days.

(21) Appl. No.: 10/733,077

(22) Filed: Dec. 11, 2003

(65) Prior Publication Data

US 2005/0012511 A1    Jan. 20, 2005

(30) Foreign Application Priority Data

Jul. 17, 2003    (TW) ................................ 92119567 A

(51) Int. Cl.$^7$ ........................................... G01R 19/00
(52) U.S. Cl. .................. 324/76.11; 324/76.16
(58) Field of Search ................ 324/705, 607, 324/76.16, 76.48, 76.47, 76.83, 76.11; 341/164, 341/169

(56) References Cited

U.S. PATENT DOCUMENTS

| | | | | |
|---|---|---|---|---|
| 3,875,501 A | * | 4/1975 | Hayashi | 324/712 |
| 4,112,428 A | * | 9/1978 | Dorsman | 341/158 |
| 4,362,988 A | * | 12/1982 | Weimer | 324/704 |
| 5,355,136 A | * | 10/1994 | Katagiri | 341/157 |
| 5,745,062 A | * | 4/1998 | Tavernetti | 341/135 |

* cited by examiner

Primary Examiner—Anjan Deb
(74) Attorney, Agent, or Firm—Thomas, Kayden, Horstemeyer & Risley

(57) ABSTRACT

An analog signal measuring device for measuring an analog signal includes a digital controller, a waveform converter and a comparator. The digital controller includes a PWM controller for outputting a pulse signal having an adjustable pulse width to the waveform converter, which converts the pulse signal into a sawtooth wave or a triangle wave for output as a carrier signal. Next, the comparator feeds a comparison pulse signal, which is obtained by comparing the carrier signal to the analog signal, to the digital controller, which enables or disables the counter to generate a count value corresponding to the comparison pulse signal. Since the count value depends on the comparison pulse signal and the type of the comparison pulse signal is directly related to the analog signal, the digital controller may get the analog signal according to the count value.

19 Claims, 5 Drawing Sheets

ANALOG SIGNAL MEASURING DEVICE AND METHOD

This application claims the benefit of Taiwan application Serial No. 92119567, filed Jul. 17, 2003.

BACKGROUND OF THE INVENTION

1. Field of the Invention

The invention relates to a signal measuring device and method, and more particularly to an analog signal measuring device and method.

2. Description of the Related Art

Recently, the electric circuits are greatly advanced. In the circuits which are getting more and more precise, various detecting functions are often performed using the signal measuring technology. Thus, the signal measuring device is of great importance in the circuit having extremely complicated functions.

Since the integrated circuits are well developed, microcontrollers are often used to measure the analog signals. In this kind of microcontrollers, a circuit has to be provided to convert the analog signal into the digital signal so that the digitized operations may be performed. In practice, an analog/digital converter (ADC) is provided to perform the signal converting process.

The microcontroller with an ADC is more expensive than a digital controller without an ADC, and the power loss or consumption of the microcontroller is also greater. In order to satisfy the measurement demands for the analog signal and effectively reduce the cost and power loss, it is necessary to develop a device and method for measuring the analog signal using the digital controller (a purely digitized controller without any analog/digital converter or microcontroller) so as to save the power and cost and enhance the product's competition ability.

SUMMARY OF THE INVENTION

It is therefore an object of the invention to provide an analog signal measuring device and method with reduced cost and power consumption.

The invention achieves the above-identified object by providing an analog signal measuring device, which is briefly described in the following.

The analog signal measuring device for measuring an analog signal includes a digital controller, a waveform converter and a comparator. The digital controller includes a PWM controller for outputting a pulse signal having an adjustable pulse width to the waveform converter, which converts the pulse signal into a sawtooth wave or a triangle wave for output as a carrier signal. Next, the comparator feeds a comparison pulse signal, which is obtained by comparing the carrier signal to the analog signal, to the digital controller, which enables or disables the counter to generate a count value corresponding to the comparison pulse signal. Since the count value depends on the comparison pulse signal and the type of the comparison pulse signal is directly related to the analog signal, the digital controller may get a measured value of the analog signal according to the count value.

The invention also achieves the above-identified object by providing an analog signal measuring method includes the following steps.

First, a PWM controller in a digital controller generates and outputs a programmable pulse signal. Then, a waveform converting circuit is used to convert the pulse signal into a carrier signal. Next, the carrier signal is compared to a to-be-measured analog signal to generate a comparison pulse signal having a pulse width varying with the variation of the level (high or low) of the analog signal. The generated comparison pulse signal may enable a counter in the digital controller to generate a count value, and the digital controller may get a measurement result of the analog signal according to the count value. In practice, it is possible to set the digital controller to a negative-edge trigger interruption mode before the measurement. After the comparison pulse signal is fed into the digital controller, a negative edge of the comparison pulse signal may be used to trigger the digital controller to generate an interruption signal, which enables the counter to start counting. In addition, the interruption setting of the digital controller is changed to a positive-edge trigger interruption mode according to the same interruption signal. Next, the positive edge of the comparison pulse signal enables the digital controller to start counting and to output the interruption signal again, which disables the counter from counting and to get the count value. The measured value of the analog signal may be computed according to the count value.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
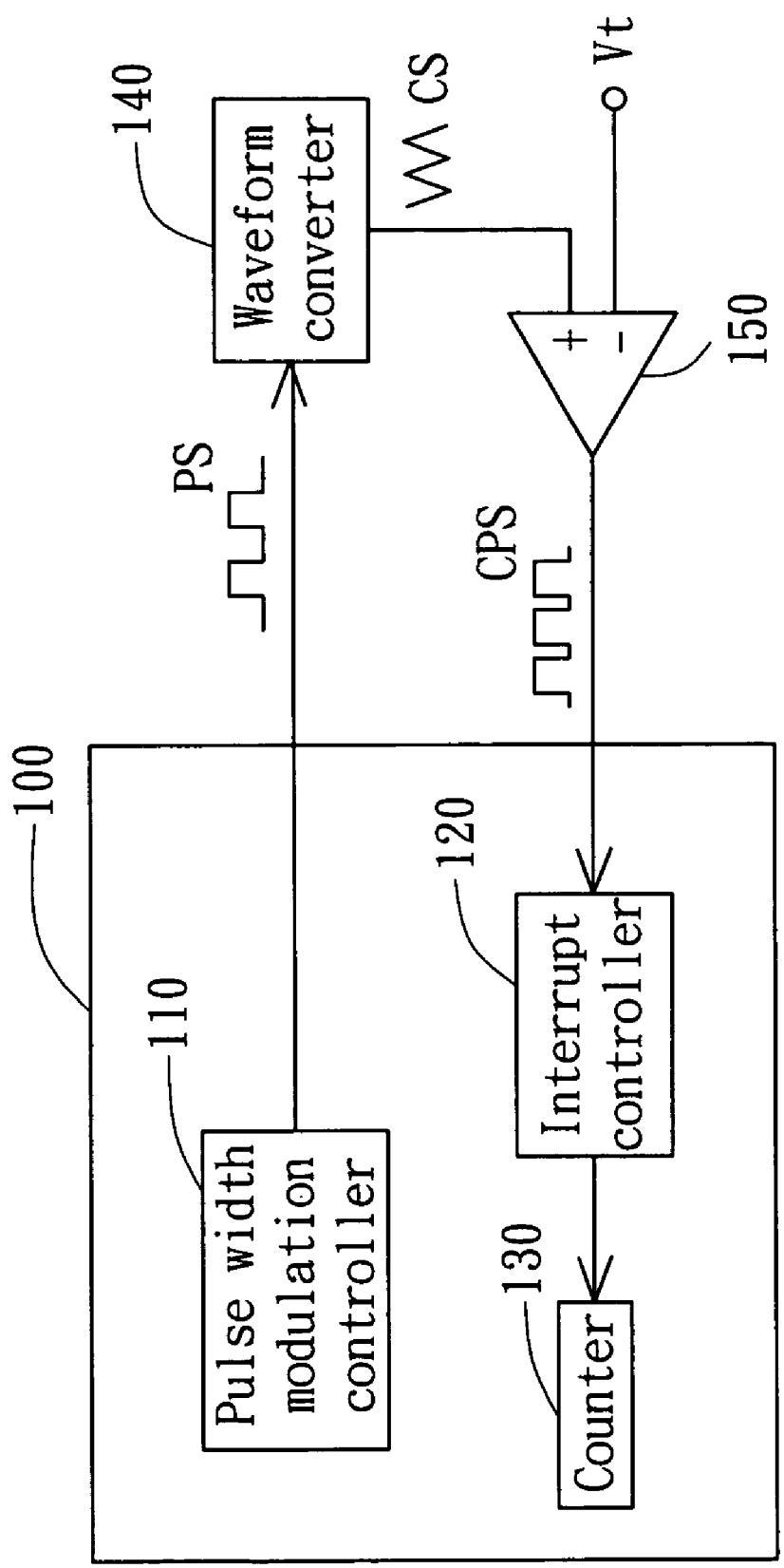
FIG. 1 is a block diagram showing an analog signal measuring device according to a preferred embodiment of the invention.

FIG. 1 is a block diagram showing an analog signal measuring device according to a preferred embodiment of the invention. The analog signal measuring device includes a digital controller 100, a waveform converter 140 and a comparator 150 for measuring an analog signal Vt, which may be, for example, a DC (direct current) voltage. A pulse width modulation (PWM) controller 110 for outputting a pulse signal PS having an adjustable pulse width to the waveform converter 140 is disposed in the digital controller 100. After the waveform converter 140 receives the pulse signal PS, the pulse waveform may be converted into a sawtooth wave or a triangle wave and then output as a carrier signal CS. In practice, the waveform converter 140 may be implemented by an RC circuit or a triangle wave generating circuit.

Next, the comparator 150 compares the carrier signal CS to the analog signal Vt and then generates a comparison pulse signal CPS having a pulse width varying with the variation of the level of the analog signal Vt. In this embodiment, the pulse width of the comparison pulse signal CPS is getting narrower as the analog signal Vt is getting higher, but the analog signal Vt should not exceed the maximum voltage of the carrier signal CS. On the other hand, an interrupt controller 120 is disposed in the digital controller 100, and a counter 130 may be enabled to start counting or disabled from counting according to the comparison pulse signal CPS in order to generate a count value corresponding to the comparison pulse signal CPS. Since the count value depends on the comparison pulse signal CPS, and the type of the comparison pulse signal CPS is directly related to the analog signal Vt, the digital controller 100 may get the magnitude of the analog signal Vt according to the count value.

Figure 2:
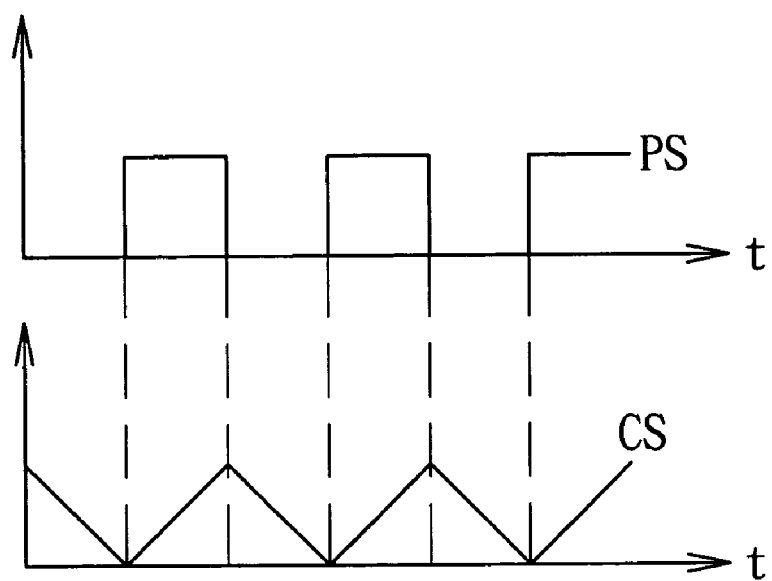
FIG. 2 shows a relationship between a pulse signal and a carrier signal.
Figure 3:
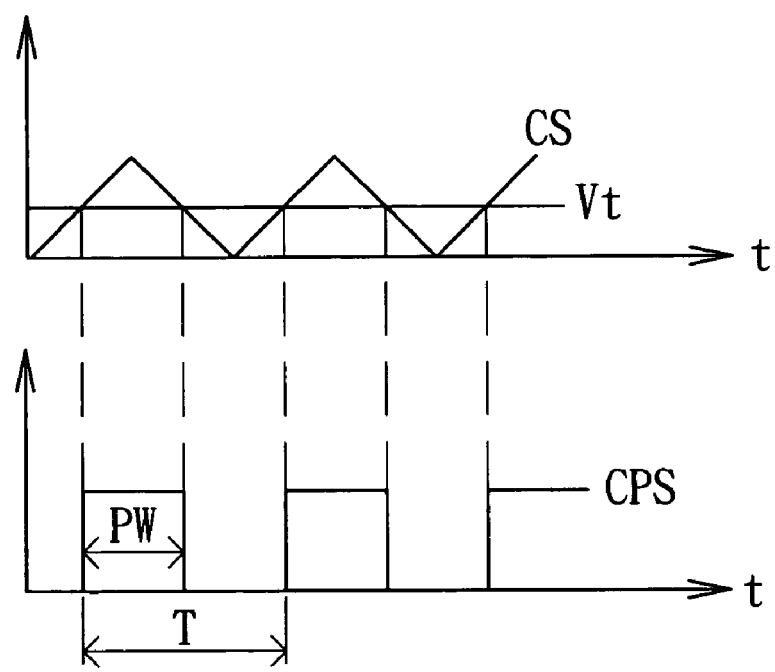
FIG. 3 shows a relationship among the carrier signal, the analog signal and the comparison pulse signal.

FIG. 2 shows a relationship between a pulse signal PS and a carrier signal CS. Taking the RC circuit as an example, properly adjusting the ratio of the resistance to the capacitance may convert the pulse signal PS, through the charge/discharge mechanism of the RC circuit, into the carrier signal CS with the triangle wave for output and for comparison with the analog signal Vt. FIG. 3 shows a relationship among the carrier signal CS, the analog signal Vt and the comparison pulse signal CPS. Taking FIG. 1 as an example, since the carrier signal CS and the analog signal Vt are coupled to a positive input terminal and a negative input terminal of the comparator 150, respectively, the comparison pulse signal CPS is at a high level when the analog signal Vt is smaller than the carrier signal CS, and otherwise the comparison pulse signal CPS is at a low level. In other words, the pulse width PW of the comparison pulse signal CPS varies with the variation (high or low) of the analog signal Vt. This example also reflects that the analog signal Vt is inversely proportional to the duty cycle of the comparison pulse signal CPS, wherein the duty cycle is the ratio of the pulse width PW to the cycle T.

Figure 4:
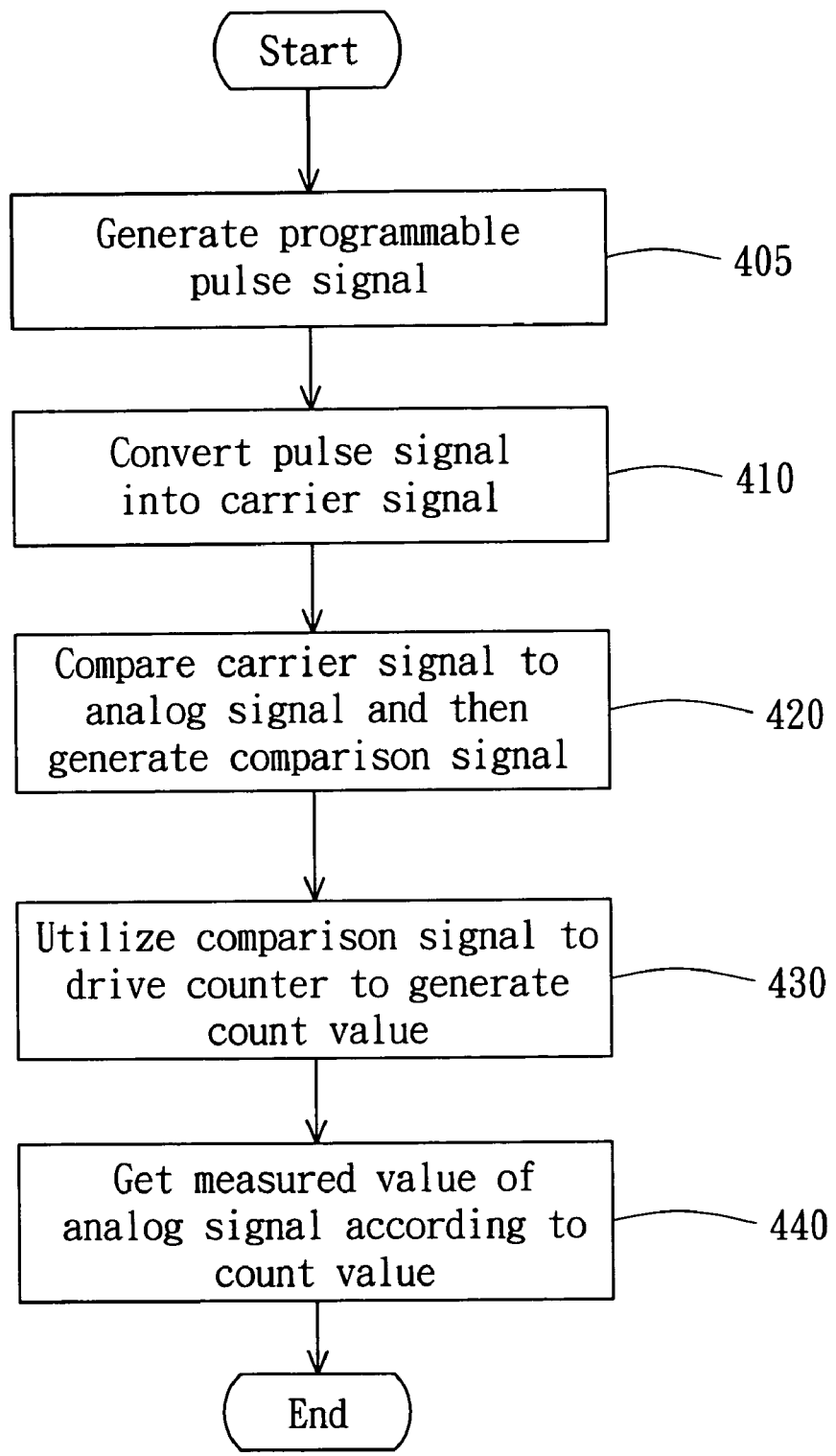
FIG. 4 is a flow chart showing an analog signal measuring method according to a preferred embodiment of the invention.

FIG. 4 is a flow chart showing an analog signal measuring method according to a preferred embodiment of the invention. First, the PWM controller in the digital controller may generate a programmable pulse signal having a pulse width that may be adjusted freely, and may output the programmable pulse signal PS (step 405). Then, a waveform converting circuit is utilized to convert the pulse signal into a carrier signal CS (step 410). Next, the carrier signal and the to-be-measured analog signal Vt are compared to generate a comparison pulse signal CPS having a pulse width varying with the variation of the analog signal (step 420). After the comparison pulse signal is generated, it may be used to drive the counter in the digital controller to generate a count value (step 430). Accordingly, the digital controller may get the measurement result of the analog signal according to the count value (step 440). For example, it is possible to set the digital controller to a negative-edge trigger interruption mode before the measurement. After the comparison pulse signal is fed into the digital controller, the negative edge of the comparison pulse signal may be used to trigger the digital controller to generate an interruption signal, which enables the counter to start counting. In addition, the interruption setting of the digital controller is changed to a positive-edge trigger interruption mode according to the same interruption signal. Next, the positive edge of the comparison pulse signal enables the digital controller to start counting and to output the interruption signal again, which disables the counter from counting and to get the count value. The measured value of the analog signal may be computed according to the count value.

Figure 5:
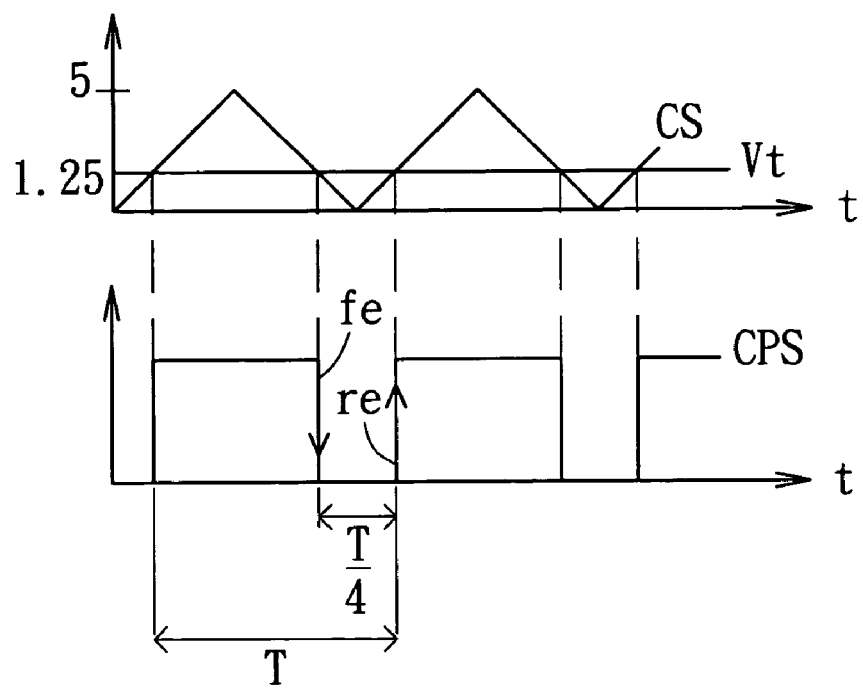
FIG. 5 further shows a relationship among the carrier signal, the analog signal and the comparison pulse signal.

FIG. 5 further shows a relationship among the carrier signal CS, the analog signal Vt and the comparison pulse signal CPS. Taking this figure as an example, a peak value of the carrier signal CS is 5V, and the to-be-measured analog signal Vt is 1.25V. The comparison pulse signal CPS after the carrier signal CS and the analog signal Vt are compared is illustrated in this figure. It is to be noted that since the level of the analog signal Vt is equal to one fourth of the peak value of the carrier signal CS, the cycle width occupied by the logic 0 in the comparison pulse signal CPS is also equal to one fourth of the whole cycle time T.

In practice, the count frequency of the counter may be set to N (N=100, for example) times that of the carrier frequency, and the negative edge fe and positive edge re of the comparison pulse signal CPS may be respectively utilized to enable and disable the counter to generate a count value corresponding to the comparison pulse signal CPS. Since the frequency of the counter is 100 times of the carrier frequency, the count value generated in a cycle time T should be 100. Furthermore, since the peak value of the carrier signal CS is 5V, it is known that the magnitude of the recognizable voltage (or the scale voltage) is equal to 5V/100=0.05V. In this example, however, the practically total counting time from the enabling of the counter by the negative edge fe to the disabling of the counter by the positive edge re only occupies one fourth of the total cycle (i.e., T/4), and the count value should be 100×¼=25. So, the measured magnitude of the analog signal by the digital controller should be equal to the count value multiplied by the scale voltage (i.e., 25×0.05V=1.25V).

Figure 6:
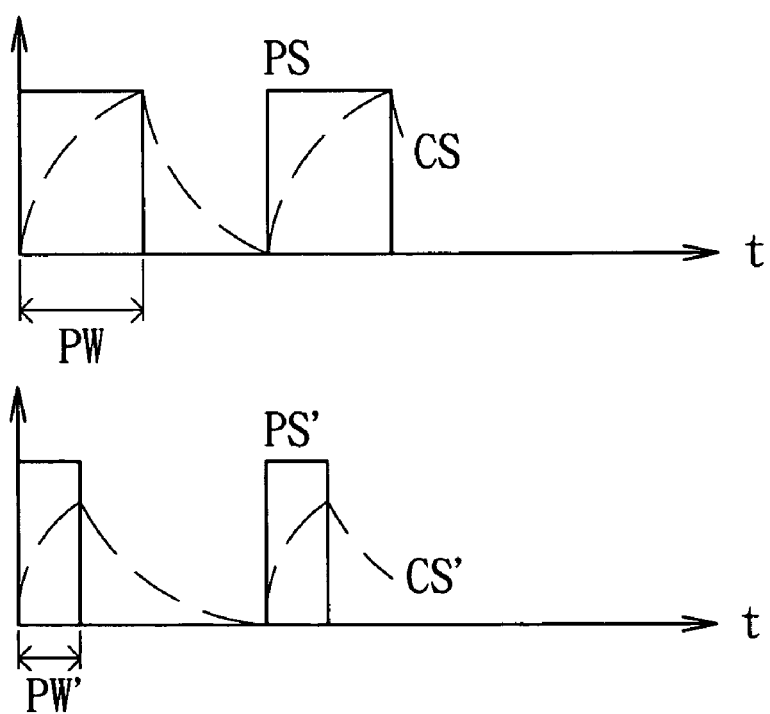
FIG. 6 shows a relationship between the pulse width variation of the pulse signal and the carrier signal.
Figure 7A:
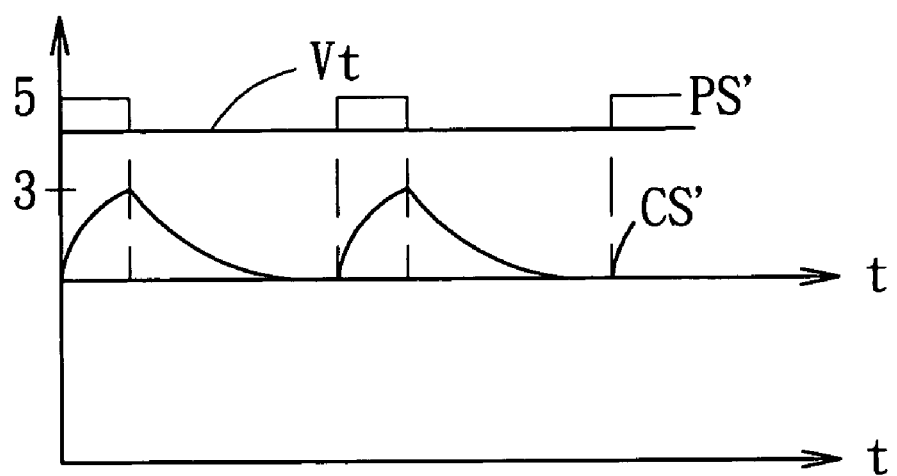
FIG. 7A shows a comparison pulse signal generated when a battery potential is higher than a low-voltage level.
Figure 7B:
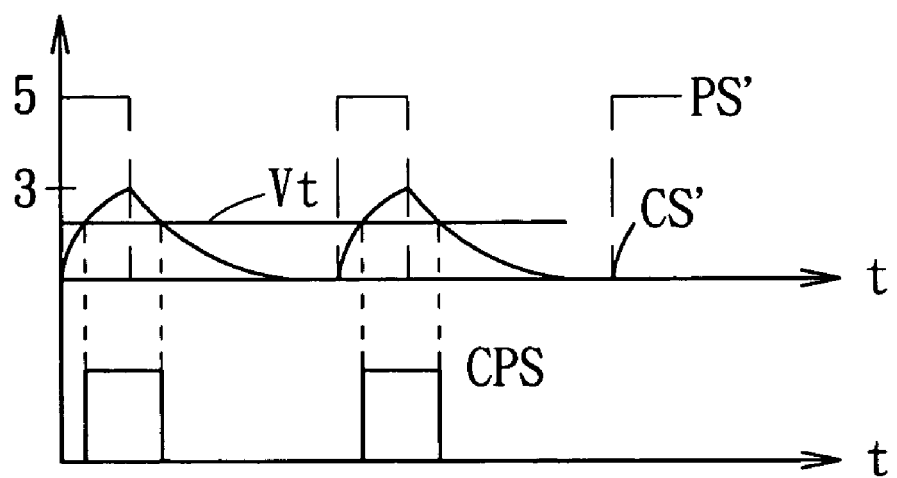
FIG. 7B shows a comparison pulse signal generated when a battery potential is lower than a low-voltage level.

Of course, in some applications for the analog voltage measurement, it is not necessary to measure the precise voltage value but only necessary to know whether or not the analog signal is greater (or smaller) than the system's default low-voltage level. For example, in the low point detection of the battery potential, the digital controller only needs to adjust the pulse width of the pulse signal output from the PWM controller when the low-voltage level has to be set. In brief, the pulse width of the pulse signal may be set according to a low-voltage level. When the analog signal is smaller than the low-voltage level, it will be detected by the digital controller. FIG. 6 shows a relationship between the pulse width variation of the pulse signal and the carrier signal. As shown in FIG. 6, when the pulse width PW of the pulse signal PS occupies ½cycle, the carrier signal CS with approximate triangle waves may be generated after the process of the RC circuit. At this time, if the pulse width of the pulse signal PS is reduced to PW', the peak value of the generated carrier signal CS' is also reduced. That is, the peak value of the carrier signal is positively related to the pulse width. Taking the low point detection of the battery voltage as an example, if the battery is fully charged to 5V, and the low-voltage level of the battery potential in the system is set to 3V for the low voltage alert, the pulse width may be adjusted from the original 50% to 30%. Next, please refer to FIG. 7A showing a comparison pulse signal generated when a battery potential is higher than a low-voltage level. Since the analog signal Vt representing the battery potential is greater than the carrier signal CS', the comparison pulse signal output from the comparator is always kept at logic 0. If the battery potential is reduced below the low-voltage level (3V corresponding to the peak value of the carrier signal in this example), a pulse type comparison pulse signal CPS may be generated by comparing the carrier signal CS' to the battery potential. The more the width of the logic 1 in the comparison pulse signal CPS, the lower the battery potential, as shown in FIG. 7B.

In other words, when the digital controller receives the comparison pulse signal with constant logic 0, it means that the battery potential is still higher than the system's default low-voltage level. If the battery potential is lower than the low-voltage level, the digital controller receives the pulse type comparison pulse signal, and the pulse width of the comparison pulse signal gets wider as the battery voltage gets lower. Consequently, the digital controller may change the setting of the low-voltage level to enable the system to issue the alert properly by merely adjusting the pulse width of the pulse signal.

The analog signal measuring device according to the embodiment of the invention at least has the following advantages.

1. The analog signal may be measured using the digital controller without an ADC, so the cost may be reduced.

2. The power loss is smaller, so the power may be saved, and the generated heat may be suppressed.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An analog signal measuring device for measuring an analog signal, the analog signal measuring device comprising:
   a digital controller for generating a measured value of the analog signal, comprising:
      a pulse width modulation (PWM) controller for outputting a programmable pulse signal having a pulse width that is adjustable so as to measure the analog signal; and
      a counter having a frequency that is based on the frequency of the programmable pulse signal;
   a waveform converter, coupled to the PWM controller, for generating and outputting a carrier signal according to the programmable pulse signal; and
   a comparator, coupled to the waveform converter and the counter of the digital controller, for comparing the carrier signal to the analog signal and then generating a comparison pulse signal, which enables the counter to start counting and to generate a count value, wherein the digital controller generates a measured value of the analog signal according to the count value.

2. The analog signal measuring device according to claim 1, wherein the analog signal is inversely proportional to a duty cycle of the comparison pulse signal.

3. The analog signal measuring device according to claim 2, wherein the comparison pulse signal has a positive edge for enabling the counter to start counting, and a negative edge for disabling the counter from counting.

4. The analog signal measuring device according to claim 1, wherein the analog signal is a DC voltage.

5. The analog signal measuring device according to claim 1, wherein the waveform converter is an RC circuit.

6. The analog signal measuring device according to claim 1, wherein the waveform converter is a triangle wave generating circuit.

7. The analog signal measuring device according to claim 1, wherein the digital controller further comprises an interrupt controller, which is coupled between the comparator and the counter, for enabling and disabling the counter according to the comparison pulse signal.

8. The analog signal measuring device according to claim 7, wherein the analog signal is directly proportional to a duty cycle of the comparison pulse signal.

9. The analog signal measuring device according to claim 7, wherein the comparison pulse signal has a positive edge and a negative edge, the interrupt controller utilizes one of the positive edge and the negative edge to enable the counter to start counting, and the other of the positive edge and the negative edge to disable the counter from counting.

10. The analog signal measuring device according to claim 9, wherein the analog signal is inversely proportional to a duty cycle of the comparison pulse signal.

11. The analog signal measuring device according to claim 7, wherein the analog signal is a DC voltage.

12. An analog signal measuring method utilizing a digital controller having a counter to measure an analog signal, the analog signal measuring method comprising the steps of:
   (k). outputting a programmable pulse signal having a pulse width that is adjustable so as to measure the analog signal by the digital controller;
   (m). generating a carrier signal according to the programmable pulse signal;
   (o). comparing the carrier signal to the analog signal and thus generating a comparison pulse signal; and
   (p). in response to the comparison pulse signal, enabling the counter to start counting and to generate a count value according to the comparison pulse signal, and getting a measured value of the analog signal according to the count value by the digital controller, wherein the frequency of the counter is based on the freciuencv of the programmable pulse signal.

13. The method according to claim 12, wherein the carrier signal is a triangle wave.

14. The analog signal measuring method according to claim 12, wherein the carrier signal is a sawtooth wave.

15. The analog signal measuring method according to claim 12, wherein step (in) comprises the steps of:
   determining a pulse width of the programmable pulse signal according to a low-voltage level; and
   generating the carrier signal according to the programmable pulse signal.

16. The analog signal measuring method according to claim 12, wherein the comparison pulse signal has a positive edge and a negative edge, and the step (p) comprises the steps of:
   setting the digital controller to a negative-edge trigger interruption mode;
   triggering the digital controller by the negative edge to enable the counter to start counting, and setting the digital controller to a positive-edge trigger interruption mode;
   triggering the digital controller by the positive edge to disable the counter from counting; and
   getting the measured value of the analog signal according to the count value.

17. The analog signal measuring method according to claim 16, wherein the carrier signal is a triangle wave.

18. The analog signal measuring method according to claim 17, wherein the analog signal is a DC voltage.

19. The analog signal measuring method according to claim 16, wherein the step (m) includes the steps of:
   determining a pulse width of the programmable pulse signal according to a low-voltage level; and
   generating the carrier signal according to the programmable pulse signal.

* * * * *